(12) United States Patent
Imaizumi et al.

(10) Patent No.: US 12,101,884 B2
(45) Date of Patent: Sep. 24, 2024

(54) ISOLATOR

(71) Applicants: Kabushiki Kaisha Toshiba, Tokyo (JP); Toshiba Electronic Devices & Storage Corporation, Tokyo (JP)

(72) Inventors: Yusuke Imaizumi, Kawasaki Kanagawa (JP); Jia Liu, Yokohama Kanagawa (JP); Yoshinari Tamura, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 105 days.

(21) Appl. No.: 17/901,997

(22) Filed: Sep. 2, 2022

(65) Prior Publication Data

US 2023/0309228 A1  Sep. 28, 2023

(30) Foreign Application Priority Data

Mar. 24, 2022 (JP) ................. 2022-048518

(51) Int. Cl.
*H05K 1/16* (2006.01)
*H05K 1/11* (2006.01)
(Continued)

(52) U.S. Cl.
CPC ............. *H05K 1/165* (2013.01); *H05K 1/111* (2013.01); *H05K 1/115* (2013.01); *H05K 1/14* (2013.01); *H01L 23/49513* (2013.01); *H01L 24/32* (2013.01); *H01L 24/48* (2013.01); *H01L 24/73* (2013.01); *H01L 2224/32245* (2013.01); *H01L 2224/48227* (2013.01); *H01L 2224/73265* (2013.01)

(58) Field of Classification Search
CPC ........ H05K 1/165; H05K 1/111; H05K 1/115; H05K 1/14
USPC ........................................... 361/784
See application file for complete search history.

(56) References Cited

U.S. PATENT DOCUMENTS

| | | | |
|---|---|---|---|
| 9,035,422 B2 | 5/2015 | Khanolkar et al. | |
| 2014/0091474 A1* | 4/2014 | Starkston | H01L 23/5226 361/767 |

(Continued)

FOREIGN PATENT DOCUMENTS

| | | |
|---|---|---|
| JP | 2021-048222 A | 3/2021 |
| JP | 2021-150579 A | 9/2021 |

(Continued)

*Primary Examiner* — Andargie M Aychillhum
(74) *Attorney, Agent, or Firm* — Kim & Stewart LLP

(57) ABSTRACT

According to one embodiment, an isolator includes a first wiring board and a second wiring board. The first wiring board includes a first insulating layer including first and second principal surfaces; a first coil provided on the first principal surface; and a first pad provided on the first principal surface and electrically connected to the first coil. The second wiring board includes a second insulating layer including third and fourth principal surfaces; a second coil provided on the third principal surface; and a second pad provided on the fourth principal surface and electrically connected to the second coil. The first and second coils are arranged in such a manner as to face each other, and an external size of the second wiring board is smaller than an external size of the first wiring board.

15 Claims, 5 Drawing Sheets

(51) Int. Cl.
*H05K 1/14* (2006.01)
*H01L 23/00* (2006.01)
*H01L 23/495* (2006.01)

(56) References Cited

U.S. PATENT DOCUMENTS

| | | | |
|---|---|---|---|
| 2016/0120034 A1* | 4/2016 | Chen | ............... H05K 1/0245 |
| | | | 361/748 |
| 2021/0266199 A1 | 8/2021 | Ohguro et al. | |
| 2021/0296043 A1 | 9/2021 | Nega et al. | |
| 2021/0296265 A1 | 9/2021 | Fuji et al. | |
| 2021/0296427 A1 | 9/2021 | Ishiguro et al. | |
| 2021/0305671 A1 | 9/2021 | Ohguro | |
| 2023/0093818 A1 | 3/2023 | Murasaki et al. | |

FOREIGN PATENT DOCUMENTS

| | | |
|---|---|---|
| JP | 2021-150830 A | 9/2021 |
| JP | 2021-150839 A | 9/2021 |
| JP | 2021-153237 A | 9/2021 |
| JP | 2023-046880 A | 4/2023 |

* cited by examiner

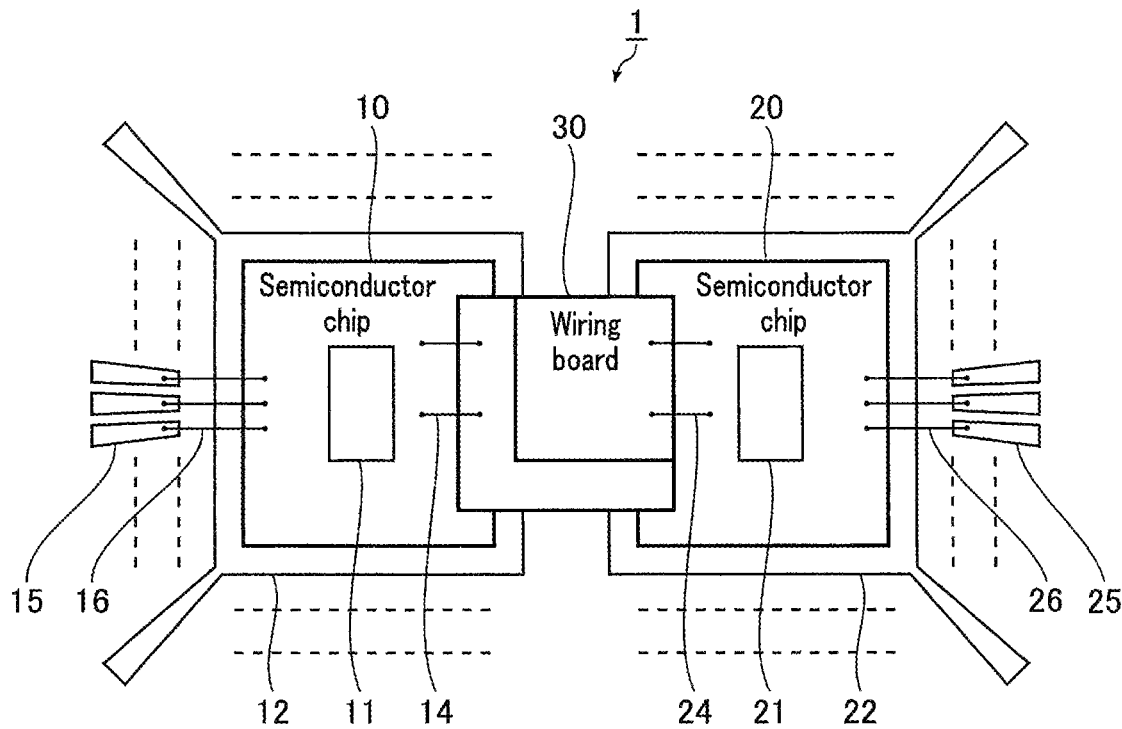
F I G. 1
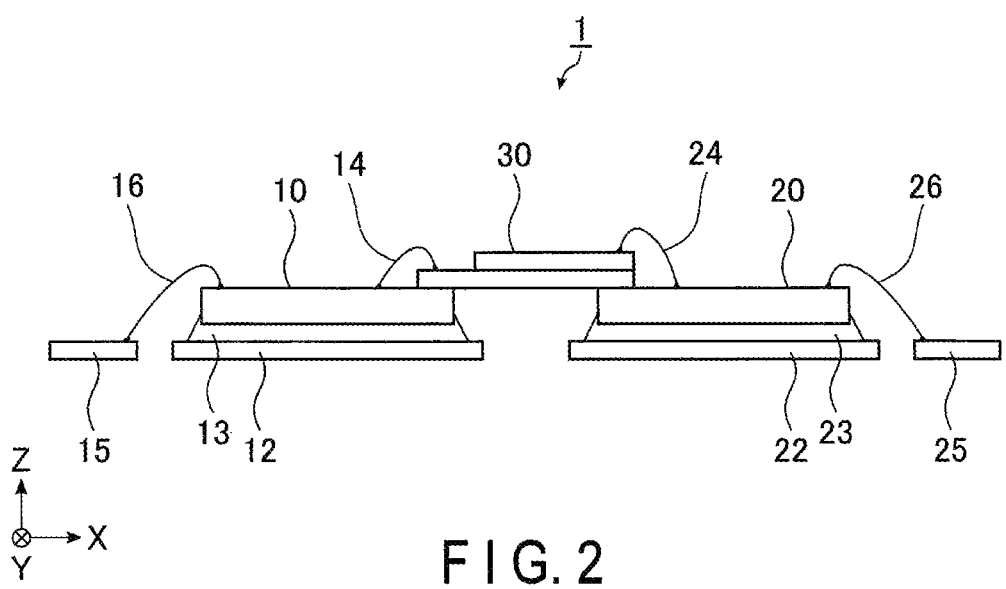
F I G. 2

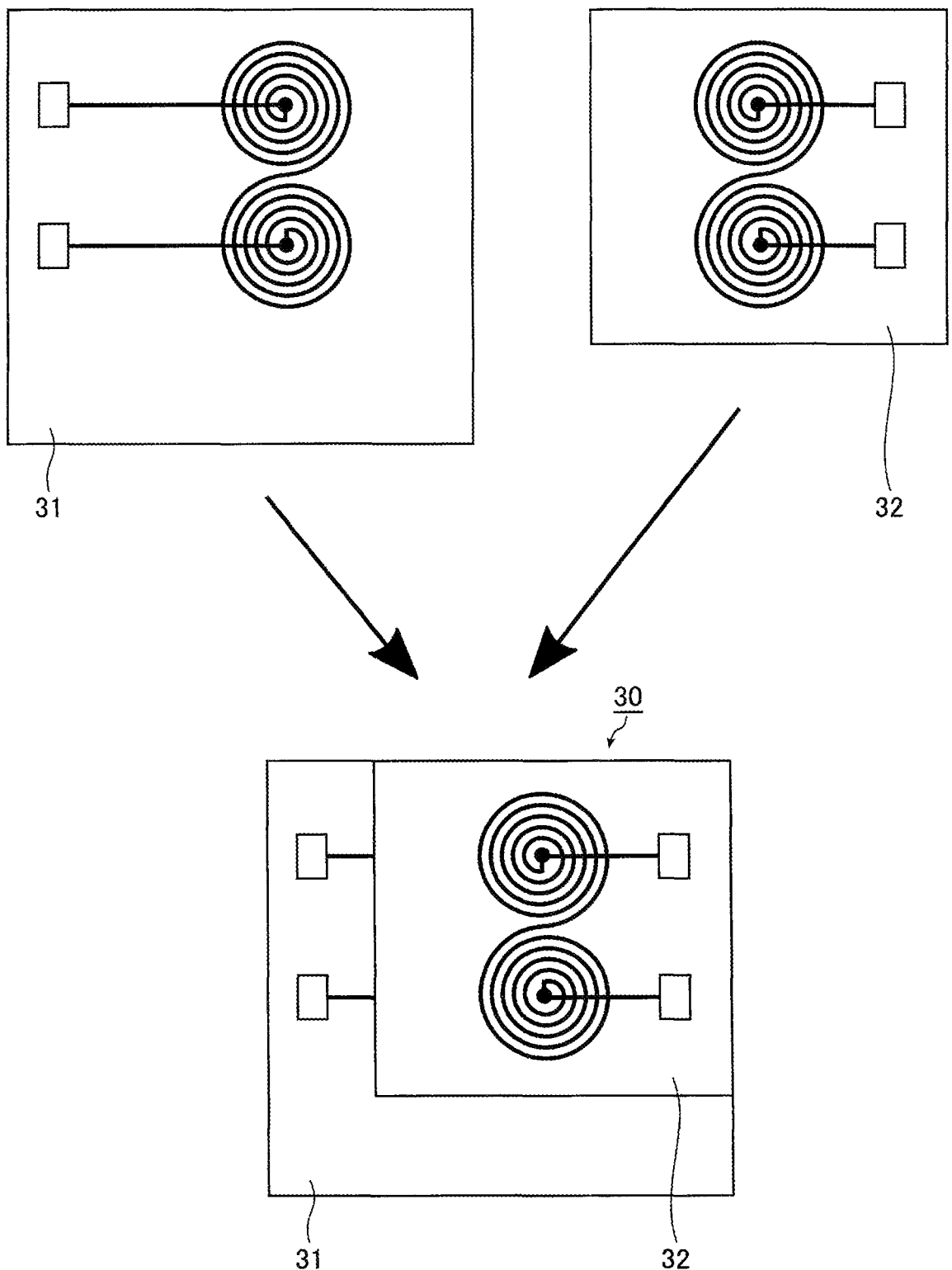
F I G. 7

ISOLATOR

CROSS-REFERENCE TO RELATED APPLICATIONS

This application is based upon and claims the benefit of priority from Japanese Patent Application No. 2022-048518, filed Mar. 24, 2022, the entire contents of which are incorporated herein by reference.

FIELD

Embodiments described herein relate generally to an isolator.

BACKGROUND

There has been known an isolator that transmits signals from a transmission side circuit to a reception side circuit in a state in which the transmission side circuit and the reception side circuit are insulated.

BRIEF DESCRIPTION OF THE DRAWINGS

FIG. 1 is a plan view showing an isolator of an embodiment.

FIG. 2 is a side view showing the isolator of the embodiment.

FIG. 7 is a plan view of the first and second wiring boards in the embodiment, and a wiring board obtained by bonding these.

DETAILED DESCRIPTION

Figure 3:
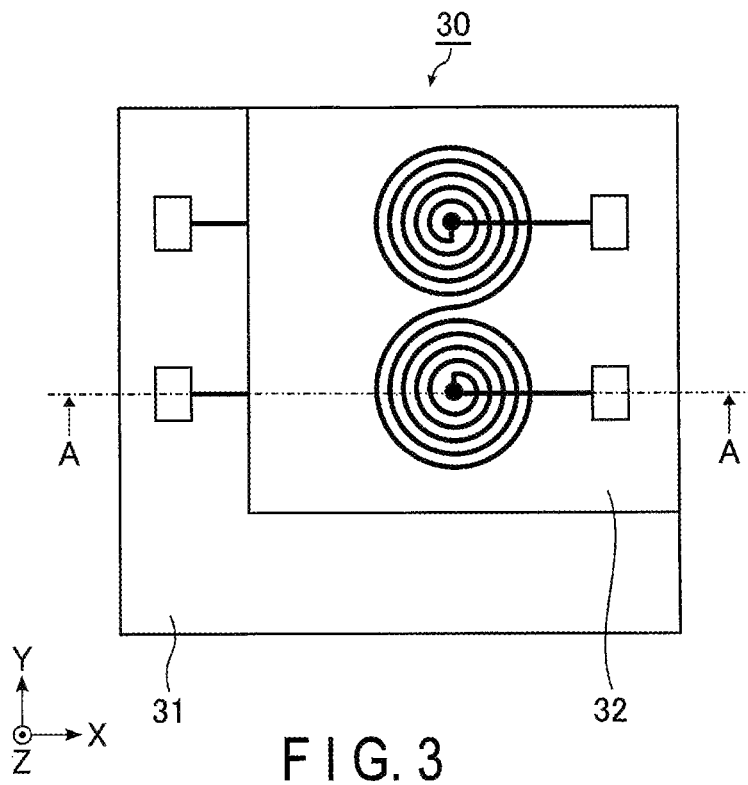
FIG. 3 is a plan view of a wiring board in the isolator of the embodiment.

In general, according to one embodiment, an isolator includes a first wiring board and a second wiring board. The first wiring board includes a first insulating layer including a first principal surface and a second principal surface opposite to the first principal surface; a first coil provided on the first principal surface; and a first pad that is provided on the first principal surface and electrically connected to the first coil. The second wiring board includes a second insulating layer including a third principal surface and a fourth principal surface opposite to the third principal surface; a second coil provided on the third principal surface; and a second pad that is provided on the fourth principal surface and electrically connected to the second coil. The first coil and the second coil are arranged in, such a manner as to face each other, and an external size of the second wiring board is smaller than an external size of the first wiring board.

Hereinafter, embodiments will be described with reference to the drawings. In the following description, components having the same function and configuration are assigned common reference signs. In addition, an embodiment to be described below exemplifies an apparatus and a method for embodying the technical idea of the embodiment, and is not intended to specify the material, shape, structure, arrangement, and the like of a component.

An isolator of an embodiment will be described. In the embodiment, an isolator having a structure in which a transformer that transmits signals is formed on a printed wiring board (or printed board) will be described. The isolator transmits signals utilizing a change in magnetic field (or magnetic signal) in a state in which a transmission side circuit (or primary side circuit) and a reception side circuit (or secondary side circuit) are insulated.

FIG. 1 is a plan view showing the isolator of the embodiment. FIG. 2 is a side view showing the isolator of the embodiment.

As illustrated in FIGS. 1 and 2, the isolator 1 includes a semiconductor chip 10, a semiconductor chip 20, and a printed wiring board 30. The semiconductor chip 10 includes a first circuit 11 formed on a semiconductor substrate. The first circuit 11 includes, for example, a transmission/reception circuit and a modulation/demodulation circuit. The semiconductor chip 20 includes a second circuit 21 formed on a semiconductor substrate. The second circuit 21 includes, for example, a transmission/reception circuit and a modulation/demodulation circuit. The printed wiring board 30 includes, for example, a flexible printed wiring board (or flexible printed circuits: FPC) having flexibility. For example, the isolator 1 includes a semiconductor package in which the semiconductor chip 10, the semiconductor chip 20, and the wiring board 30 are sealed by resin (not illustrated). Hereinafter, a printed wiring board including the flexible printed wiring board will be simply referred to as a wiring board. The details of the wiring board 30 will be described later.

The semiconductor chip 10 is bonded on a die pad 12 using an insulating adhesive 13. The semiconductor chip 20 is bonded on a die pad 22 using an insulating adhesive 23. The wiring board 30 is provided on the semiconductor chip 10 and the semiconductor chip 20.

A bonding wire 14 is provided between the semiconductor chip 10 and the wiring board 30. The first circuit 11 of the semiconductor chip 10 and the wiring board 30 are electrically connected by the bonding wire 14. A bonding wire 24 is provided between the semiconductor chip 20 and the wiring board 30. The second circuit 21 of the semiconductor chip 20 and the wiring board 30 are electrically connected by the bonding wire 24.

A bonding wire 16 is provided between the semiconductor chip 10 and a lead frame 15. The first circuit 11 of the semiconductor chip 10 and the lead frame 15 are electrically connected by the bonding wire 16. Furthermore, a bonding wire 26 is provided between the semiconductor chip 20 and a lead frame 25. The second circuit 21 of the semiconductor chip 20 and the lead frame 25 are electrically connected by the bonding wire 26.

Hereinafter, the wiring board 30 in the isolator 1 will be described.

Figure 4:
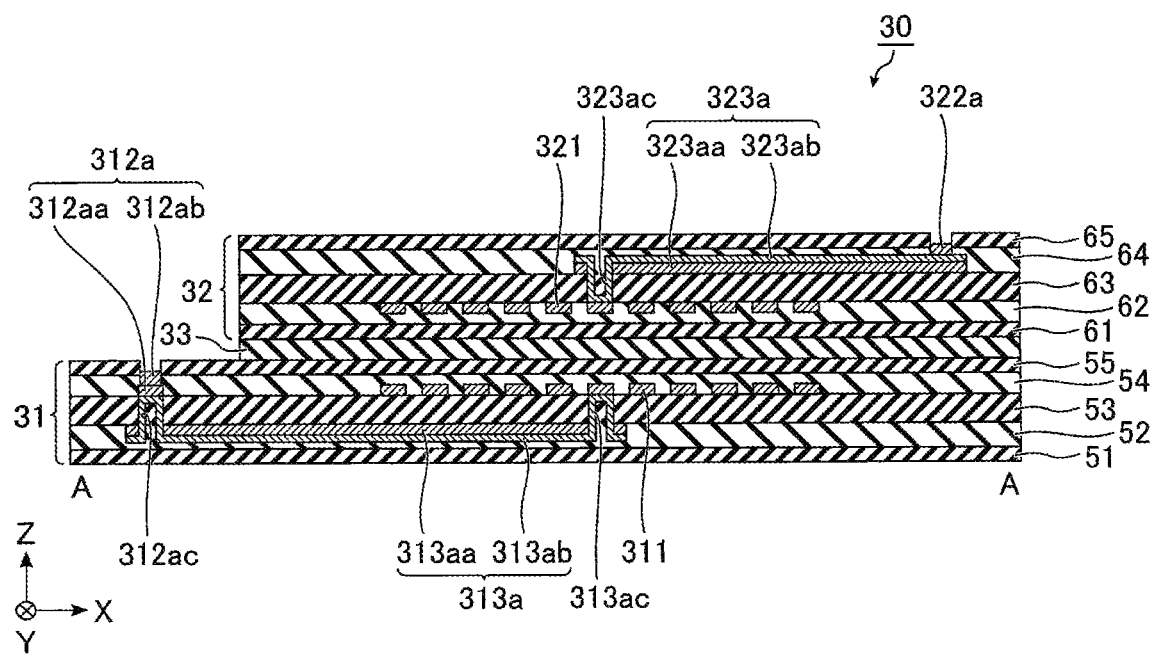
FIG. 4 is a cross-sectional view taken along an A-A line in FIG. 3.

FIG. 3 is a plan view showing the wiring board 30 in the isolator of the embodiment. FIG. 4 is a cross-sectional view taken along an A-A line in FIG. 3, and illustrates a cross-sectional structure of the wiring board 30. In FIGS. 3 and 4, two directions orthogonal to each other and parallel to the top surface of the wiring board 30 are regarded as an X direction and a Y direction, and a direction orthogonal to the X direction and the Y direction (XY-plane) (i.e., a direction in which a conductive layer and an insulating layer in the wiring board 30 are stacked) is regarded as a Z direction (or a stack direction).

As illustrated in FIGS. 3 and 4, the wiring board 30 includes a first wiring board 31, a second wiring board 32, and an insulating layer (for example, silicon paste material) 33. The first wiring board 31 includes a flexible wiring board having flexibility. The second wiring board 32 similarly includes a flexible wiring board having flexibility.

The second wiring board 32 is provided on the first wiring board 31 via the insulating layer 33. The first wiring board 31 and the second wiring board 32 are bonded by the insulating layer 33. In addition, in the X direction, an external size of the second wiring board 32 is smaller than an external size of the first wiring board 31. Furthermore, in the Y direction, an external size of the second wiring board 32 is smaller than an external size of the first wiring board 31. In other words, in the X direction, a length of the second wiring board 32 is shorter than a length of the first wiring board 31. Furthermore, in the Y direction, a length of the second wiring board 32 is shorter than a length of the first wiring board 31. Note that cross-sectional structures of the first wiring board 31 and the second wiring board 32 will be described later.

Figure 5:
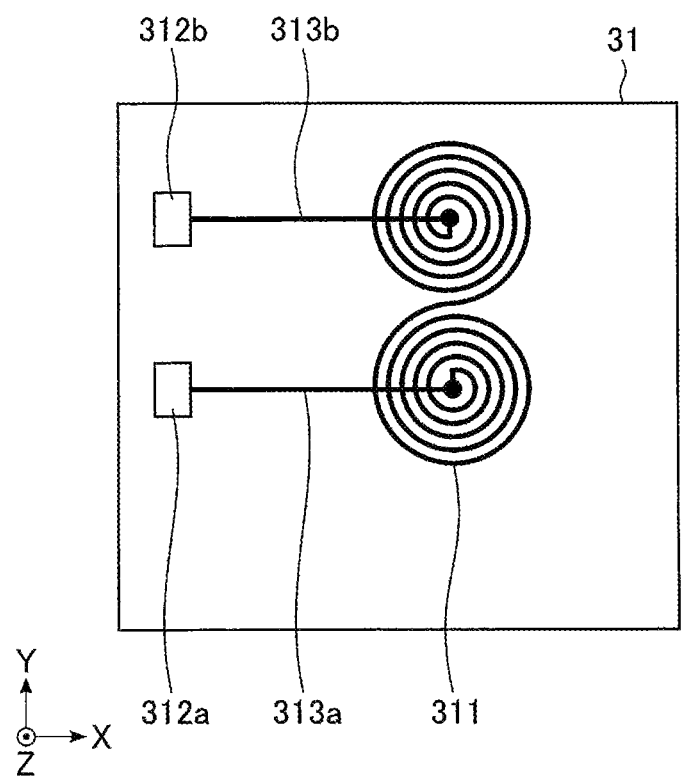
FIG. 5 is a plan view of a first wiring board included in the wiring board in the embodiment.
Figure 6:
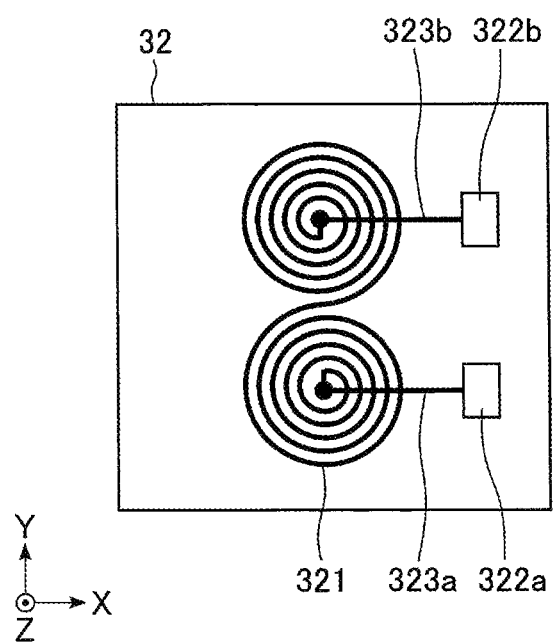
FIG. 6 is a plan view of a second wiring board included in the wiring board in the embodiment.

FIGS. 5 and 6 respectively show plan views of the first wiring board 31 and the second wiring board 32. These diagrams are diagrams showing an insulating layer in a perspective manner.

The first wiring board 31 illustrated in FIG. 5 includes a first coil 311, pads (or terminals) 312a and 312b, and wiring layers 313a and 313b. The pad 312a is electrically connected to the first coil 311 via the wiring layer 313a. Furthermore, the first coil 311 is electrically connected to the pad 312b via the wiring layer 313b.

The first coil 311 includes two conductors spirally winded along the XY-plane (hereinafter, described as spiral conductors). The two spiral conductors included in the first coil 311 have a predetermined inductance. The two spiral conductors are connected with each other at one end of an outer peripheral part. One end of a central part of one spiral conductor is electrically connected to the pad 312a via the wiring layer 313a. Furthermore, one end of a central part of another spiral conductor is electrically connected to the pad 312b via the wiring layer 313b.

The second wiring board 32 illustrated in FIG. 6 includes a second coil 321, pads (or terminals) 322a and 322b, and wiring layers 323a and 323b. The pad 322a is electrically connected to the second coil 321 via the wiring layer 323a. Furthermore, the second coil 321 is electrically connected to the pad 322b via the wiring layer 323b.

The second coil 321 includes two conductors spirally winded along the XY-plane. The two spiral conductors included in the second coil 321 have a predetermined inductance. The two spiral conductors are connected with each other at one end of an outer peripheral part. One end of a central part of one spiral conductor is electrically connected to the pad 322a via the wiring layer 323a. Furthermore, one end of a central part of another spiral conductor is electrically connected to the pad 322b via the wiring layer 323b.

As illustrated in FIG. 7, by bonding the first wiring board 31 and the second wiring board 32, the wiring board 30 is formed.

Hereinafter, the cross-sectional structure of the wiring board 30 will be described with reference to FIG. 4. As described above, the second wiring board 32 is provided on the first wiring board 31 via the insulating layer 33.

First of all, the structure of the first wiring board 31 will be described. The first wiring board 31 has a multilayer wiring structure (or two-sided wiring structure) including two conductive layers. More specifically, the first wiring board 31 includes an insulating layer 51, an adhesive 52, a first conductive layer including the wiring layers 313a (and 313b), an insulating layer 53, a second conductive layer including the first coil 321 and the pads 312a (and 312b), an adhesive 54, and an insulating layer 55. The first conductive layer includes the wiring layers 313a (and 313b). The second conductive layer includes the first coil 311 and the pads 312a (and 312b).

The insulating layer 51, the adhesive 52, the wiring layer 313a, the insulating layer 53, the first coil 311 and the pad 312a, the adhesive 54, and the insulating layer 55 are stacked in order in the Z direction. More specifically, the wiring layer 313a is provided on the insulating layer 51. The insulating layer 53 is provided on the wiring layer 313a. In other words, the wiring layer 313a is arranged between the insulating layer 51 and the insulating layer 53, and the insulating layer 53 and the insulating layer 51, and the wiring layer 313a and the insulating layer 51 are bonded by the adhesive 52.

The first coil 311 and the pad 312a are provided on the insulating layer 53. The insulating layer 55 is provided on the first coil 311. The insulating layer 55 on the pad 312a is removed and the upper part of the pad 312a is opened. In other words, the first coil 311 and the pad 312a are arranged between the insulating layer 53 and the insulating layer 55, and the insulating layer 53 and the insulating layer 55, and the first coil 311 and the insulating layer 55 are bonded by the adhesive 54.

The first coil 311 includes copper, for example. A thickness of the first coil 311 is 6 μm to 12 μm (6 μm or more and 12 μm or less), for example. The first coil 311 is formed of copper foil bonded on the insulating layer 53, for example.

The wiring layer 313a extends in the X direction from the central part of the spirally-winded first coil 311 to the pad 312a. The wiring layer 313a includes a conductive layer 313aa and a conductive layer 313ab stacked in the Z direction. For example, the conductive layers 313aa and 313ab include copper. The conductive layer 313aa is formed of copper foil bonded on the insulating layer 53, and the conductive layer 313ab is formed by plating. A via 313ac penetrating through the insulating layer 53 is provided between the first coil 311 and the wiring layer 313a.

The pad 312a includes a conductive layer 312aa and a conductive layer 312ab stacked in the Z direction. For example, the conductive layer 312aa includes copper. The conductive layer 312ab includes stacked nickel, palladium, and gold. The conductive layer 312aa is formed of copper foil bonded on the insulating layer 53, and the conductive layer 312ab is formed by plating. A via 312ac penetrating through the insulating layer 53 is provided between the pad 312a and the wiring layer 313a.

The conductive layer 313ab, the via 312ac, and the via 313ac are formed by plating in the same process, for example, and are integrated. With this configuration, the pad 312a is electrically connected to the first coil 311 via the via 312ac, the wiring layer 313a, and the via 313ac.

The insulating layers 51, 53, and 55 include polyimide or a polyimide compound, for example. A thickness of the insulating layer 51 is 6 μm to 25 μm (6 μm or more and 25 μm or less), for example. A thickness of the insulating layer 53 is 6 μm to 25 μm (6 μm or more and 25 μm or less), for example. A thickness of the insulating layer 55 is 6 μm to 25 μm (6 μm or more and 25 μm or less), for example.

Next, a structure of the second wiring board 32 will be described. Similarly to the first wiring board 31, the second wiring board 32 has a multilayer wiring structure (or two-sided wiring structure) including two conductive layers. More specifically, the second wiring board 32 includes an insulating layer 61, an adhesive 62, a third conductive layer, insulating layer 63, a fourth conductive layer, the pads 322a (and 322b), an adhesive 64, and an insulating layer 65. The third conductive layer includes the second coil 321. The fourth conductive layer includes the wiring layers 323a (and 323b).

The insulating layer 61, the adhesive 62, the second coil 321, the insulating layer 63, the wiring layer 323a, the adhesive 64, and the insulating layer 65 are stacked in the Z direction. More specifically, the second coil 321 is provided on the insulating layer 61. The insulating layer 63 is provided on the second coil 321. More specifically, the second coil 321 is arranged between the insulating layer 61 and the insulating layer 63, and the insulating layer 63 and the insulating layer 61, and the second coil 321 and the insulating layer 61 are bonded by the adhesive 62.

The wiring layer 323a is provided on the insulating layer 63. The insulating layer 65 is provided on the wiring layer 323a. In addition, the pad 322a is provided on the wiring layer 323a. The insulating layer 65 on the pad 322a is removed and the upper part of the pad 322a is opened. In other words, the wiring layer 323a is arranged between the insulating layer 63 and the insulating layer 65, and the insulating layer 63 and the insulating layer 65, and the wiring layer 323a and the insulating layer 65 are bonded by the adhesive 64.

The second coil 321 includes copper, for example. A thickness of the second coil 321 is 6 μm to 12 μm (6 μm or more and 12 μm or less), for example. The second coil 321 is formed of copper foil bonded on the insulating layer 63, for example.

The wiring layer 323a extends in the X direction from the central part of the spirally-winded the second coil 321 to the pad 322a. The wiring layer 323a includes a conductive layer 323aa and a conductive layer 323ab stacked in the Z direction. For example, the conductive layers 323aa and 323ab include copper. The conductive layer 323aa is formed of copper foil bonded on the insulating layer 63, and the conductive layer 323ab is formed by plating. A via 323ac penetrating through the insulating layer 63 is provided between the second coil 321 and the wiring layer 323a.

The pad 322a includes a conductive layer. For example, the pad 322a includes stacked nickel, palladium, and gold. The pad 322a is formed by plating, for example.

The conductive layer 323ab and the via 323ac are formed by plating in the same process, for example, and are integrated. With this configuration, the pad 322a is electrically connected to the second coil 321 via the wiring layer 323a and the via 323ac.

The insulating layers 61, 63, and 65 include polyimide or a polyimide compound, for example. A thickness of the insulating layer 61 is 6 μm to 25 μm (6 μm or more and 25 μm or less), for example. A thickness of the insulating layer 63 is 6 μm to 25 μm (6 μm or mere and 25 μm or less), for example. A thickness of the insulating layer 65 is 6 μm to 25 μm (6 μm or more and 25 μm or less), for example.

In addition, as illustrated in FIG. 4, the first coil 311 of the first wiring board 31 and the second coil 321 of the second wiring board 32 are arranged in such a manner as to face each other. The insulating layers 55, 33 and 61 are arranged between the first coil 311 and the second coil 321. Thicknesses of the insulating layers 55, 33 and 61 between the first coil 311 and the second coil 321 are 13 μm to 80 μm (13 μm or more and 80 μm or less), for example. The first coil 311 and the second coil 321 thereby enter a sufficiently-insulated state.

For example, the first coil 311 is a primary side coil and the second coil 321 is a secondary side coil, and a transformer includes the first coil 311 and the second coil 321. Induced electromotive force is generated in the second coil 321 by current flowing in the first coil 311, and current flows in the second coil 321. With this configuration, current corresponding to the current flowing in the first coil 311 can be generated in the second coil 321 while the first coil 311 and the second coil 321 being kept in the insulated state.

In addition, the configuration of the embodiment can also be represented as follows.

The isolator of the embodiment includes the first wiring board 31 and the second wiring board 32. The first wiring board 31 includes the insulating layer 53 including a first principal surface and a second principal surface opposite to the first principal surface, the first coil 311 provided on the first principal surface, and the pad 312a that is provided on the first principal surface and electrically connected to the first coil 311. The second wiring board 32 includes the insulating layer 63 including a third principal surface and a fourth principal surface opposite to the third principal surface, the second coil 321 provided on the third principal surface, and the pad 322a that is provided on the fourth principal surface and electrically connected to the second coil 321. The first coil 311 and the second coil 321 are arranged in such a manner as to face each other, and an external size of the second wiring board 32 is smaller than an external size of the first wiring board 31.

The pad 312a of the first wiring board 31 is arranged at a height between the first coil 311 and the second coil 321.

A distance from the first principal surface of the insulating layer 53 to the pad 312a is shorter than a distance from the first principal surface of the insulating layer 53 to the pad 322a.

The first principal surface of the insulating layer 53 includes a region not overlapping the third principal surface of the insulating layer 63, and the pad 312a is arranged in the region.

The first wiring board 31 includes the wiring layer 313a provided on the second principal surface, and the pad 312a is electrically connected to the first coil 311 via the wiring layer 313a. The second wiring board 32 includes the wiring layer 323a provided on the fourth principal surface, and the pad 322a is electrically connected to the second coil 321 via the wiring layer 323a.

The first wiring board 31 includes the via 313ac and the via 312ac. The via 313ac is provided in the insulating layer 53 and connects the first coil 311 and the wiring layer 313a. The via 312ac is provided in the insulating layer 53 and connects the pad 312a and the wiring layer 313a. The second wiring board 32 includes the via 323ac that is provided in the insulating layer 63, and connects the second coil 321 and the wiring layer 323a.

The first wiring board 31 includes the insulating layer 51 and the insulating layer 55 that sandwich the first coil 311 and the wiring layer 313a, and the second wiring board 32 includes the insulating layer 61 and the insulating layer 65 that sandwich the second coil 321 and the wiring layer 323a.

An operation of the isolator 1 of an embodiment will be described. Here, for example, an operation to be performed until an electrical signal transmitted from the first circuit 11 of the semiconductor chip 10 is transmitted to the second circuit 21 of the semiconductor chip 20 via the first coil 311 and the second coil 321 of the wiring board 30 will be described. In this case, the first circuit 11 functions as a transmission, circuit and a modulation circuit, and the second circuit 21 functions as a reception circuit and a demodulation circuit.

First of all, the modulation circuit included in the first circuit 11 of the semiconductor chip 10 receives a first signal serving as an electrical signal, from a circuit connected to an input stage. The modulation circuit modulates and converts the first signal into a second signal, and outputs the second signal to the transmission circuit of the first circuit 11. The transmission circuit transmits the second signal to the first coil 311 via the bonding wire 14 and the wiring layer 313a. The first coil 311 converts the received second signal into a third signal serving as a magnetic signal.

The third signal is converted by the second coil 321 into a fourth signal serving as an electrical signal. The fourth signal is received by the reception circuit included in the second circuit 21 of the semiconductor chip 20, via the wiring layer 323a and the bonding wire 24. The reception circuit outputs the received fourth signal to the demodulation circuit of the second circuit 21. The demodulation circuit demodulates and coverts the fourth signal into a fifth signal, and outputs the fifth signal to a circuit connected to an output stage of the second circuit 21. The fifth signal is a signal corresponding to the first signal that has not been subjected to modulation performed by the modulation circuit of the first circuit 11.

With this configuration, in a state in which the first circuit 11 of the semiconductor chip 10 and the second circuit 21 of the semiconductor chip 20 are insulated, an electrical signal transmitted from the first circuit 11 of the semiconductor chip 10 is transmitted to the second circuit 21 of the semiconductor chip 20 via the first coil 311 and the second coil 321 of the wiring board 30.

According to the present embodiment, an isolator that can increase withstand voltage can be provided.

Figure 8:
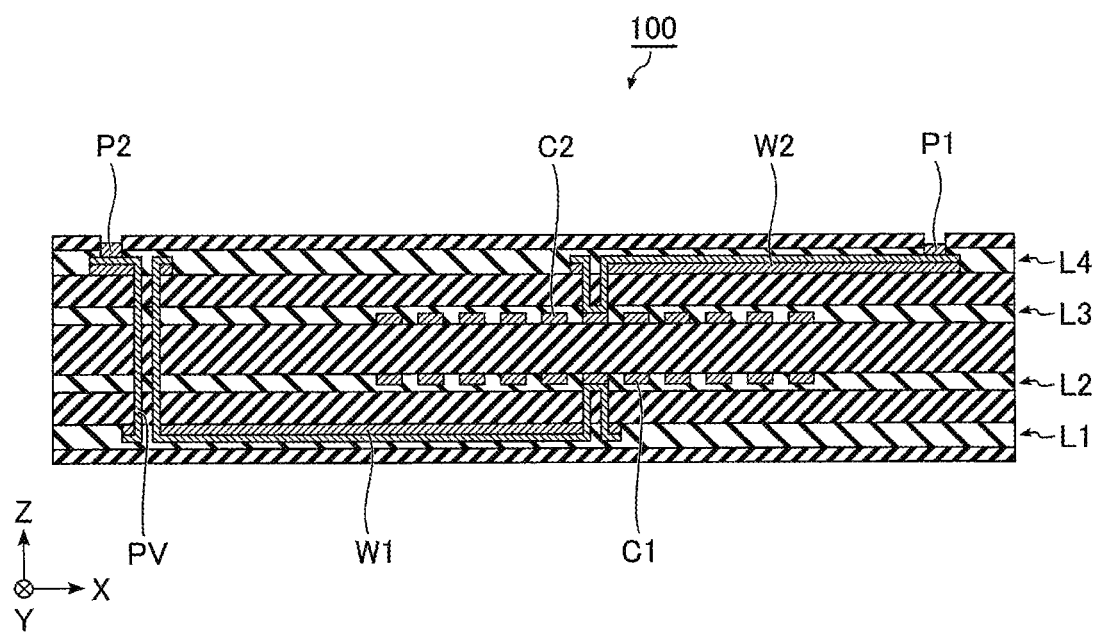
FIG. 8 is a diagram showing an example of a structure compared with the embodiment.

Hereinafter, an effect of the present embodiment will be described. FIG. 8 illustrates an example of a structure compared with the present embodiment. For example, in a case where a transformer is formed by a wiring board 100 having a four-layered structure including four conductive layers, the wiring board 100 has a structure in which a first conductive layer L1 is a lead wire W1, a second conductive layer L2 is a first coil C1, a third conductive layer L3 is a second coil C2, and a fourth conductive layer L4 is a lead wire W2.

With such a structure, in a case where pads P1 and P2 for connecting the wiring board 100 and a semiconductor chip or another wiring board are provided on the wiring board 100, to facilitate assembly, it is desirable to provide the pads P1 and P2 in the same superficial layer (for example, fourth conductive layer L4). In a structure in this case, a penetrating via PV connecting the lead wire W1 of the conductive layer L1 and the pad P2 of the conductive layer L4 is provided. On a wiring board having such a structure, if a distance between the second coil C2 and the penetrating via PV is close, insulation properties between the second coil C2 and the penetrating via PV cannot be maintained, and electric discharge sometimes occurs.

In contrast to this, according to the configuration of the present, embodiment, a via connecting a first conductive layer and a second conductive layer, and a via connecting a third conductive layer and a fourth conductive layer are provided, but a via connecting the first conductive layer and the fourth conductive layer is not provided. Thus, the problem of withstand voltage does not occur between the coil and the penetrating via. With this configuration, withstand voltage between the transmission side circuit, and the reception side circuit can be increased. Accordingly, in the embodiment, the isolator that can increase withstand voltage can be provided.

According to the configuration of the present embodiment, by avoiding providing the penetrating via from the first conductive layer to the fourth conductive layer, the weakness of withstand voltage in the X direction (or extension direction of the wiring layer 313a) can be reduced. With this configuration, the length of the wiring board 30 in the X direction can be shortened, and the wiring board 30 can be downsized.

Furthermore, according to the configuration of the present embodiment, the wiring board 30 including the first coil 311 and the second coil 321 is formed using the wiring boards 31 and 32 having a two-layered structure including two conductive layers, without using the four-layered structure including four conductive layers. Because a wiring board having the two-layered structure has simpler structure and manufacturing process as compared with a wiring board having the four-layered structure, a design rule is loosened, and lines and spaces pattern in wiring layers can be reduced. With this configuration, the wiring board 30 can be downsized. Furthermore, a degree of freedom of the design of the wiring board 30 can be increased.

As described above, according to the present embodiment, the isolator that can increase withstand voltage between the transmission side circuit and the reception side circuit can be provided. Furthermore, the isolator can be downsized.

In the above-described embodiment, the description has been given of an example that uses the flexible printed wiring board formed from a flexible substrate, as the wiring board including a transformer, but the wiring board is not limited to the flexible printed wiring board, and a rigid printed wiring board formed from a rigid substrate can also be used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An isolator comprising:
   a first wiring board including:
      a first insulating layer including a first principal surface and a second principal surface opposite to the first principal surface;
      a first coil provided on the first principal surface; and
      a first pad that is provided on the first principal surface and electrically connected to the first coil, and
   a second wiring board including:
      a second insulating layer including a third principal surface and a fourth principal surface opposite to the third principal surface;
      a second coil provided on the third principal surface; and
      a second pad that is provided on the fourth principal surface and electrically connected to the second coil,
   wherein the first coil and the second coil are arranged in such a manner as to face each other, and an external size of the second wiring board is smaller than an external size of the first wiring board.

2. The isolator according to claim 1, wherein
the first pad of the first wiring board is arranged at a height between the first coil and the second coil.

3. The isolator according to claim 1, wherein
a distance from the first principal surface of the first insulating layer to the first pad is shorter than a distance from the first principal surface of the first insulating layer to the second pad.

4. The isolator according to claim 1, wherein
the first principal surface of the first insulating layer includes a region not overlapping the third principal surface of the second insulating layer, and the first pad is arranged in the region.

5. The isolator according to claim 1, further comprising:
a third insulating layer provided between the first coil and the second coil,
wherein the third insulating layer includes polyimide.

6. The isolator according to claim 1, wherein
the first wiring board includes a first wiring layer provided on the second principal surface, and the first pad is electrically connected to the first coil via the first wiring layer, and
the second wiring board includes a second wiring layer provided on the fourth principal surface, and the second pad is electrically connected to the second coil via the second wiring layer.

7. The isolator according to claim 6, wherein
the first wiring layer extends in a first direction,
the second wiring layer extends in the first direction, and
in the first direction, a length of the second wiring board is shorter than a length of the first wiring board.

8. The isolator according to claim 6, wherein
the first wiring board includes a first via that is provided in the first insulating layer and connects the first coil and the first wiring layer, and a second via that is provided in the first insulating layer and connects the first pad and the first wiring layer, and the second wiring board includes a third via that is provided in the second insulating layer and connects the second coil and the second wiring layer.

9. The isolator according to claim 6, wherein
the first wiring board includes a fourth insulating layer and a fifth insulating layer that sandwich the first coil and the first wiring layer, and
the second wiring board includes a sixth insulating layer and a seventh insulating layer that sandwich the second coil and the second wiring layer.

10. The isolator according to claim 6, wherein
the first coil, the second coil, the first wiring layer, and the second wiring layer include copper.

11. The isolator according to claim 1, wherein
respective thicknesses of the first coil and the second coil are 6 μm or more and 12 μm or less.

12. The isolator according to claim 1, wherein
the first coil and the second coil include copper.

13. The isolator according to claim 1, wherein
the first wiring board and the second wiring board are flexible printed wiring boards.

14. The isolator according to claim 1, further comprising:
a first semiconductor chip connected to the first pad of the first wiring board via a first wire; and
a second semiconductor chip connected to the second pad of the second wiring board via a second wire.

15. The isolator according to claim 14, wherein
the first semiconductor chip includes a transmission circuit,
the second semiconductor chip includes a reception circuit,
the first pad is electrically connected to the transmission circuit, and
the second pad is electrically connected to the reception circuit.

\* \* \* \* \*